(12) United States Patent
Yamamoto et al.

(10) Patent No.: US 7,688,133 B2
(45) Date of Patent: Mar. 30, 2010

(54) POWER AMPLIFIER

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 40 days.

(21) Appl. No.: 12/254,069

(22) Filed: Oct. 20, 2008

(65) Prior Publication Data
US 2009/0309655 A1 Dec. 17, 2009

(30) Foreign Application Priority Data
Jun. 12, 2008 (JP) ............................. 2008-154492

(51) Int. Cl.
*H03F 1/14* (2006.01)
(52) U.S. Cl. ........................................ 330/51; 330/296
(58) Field of Classification Search .................. 330/51, 330/296, 285
See application file for complete search history.

(56) References Cited

U.S. PATENT DOCUMENTS

| | | | | |
|---|---|---|---|---|
| 7,262,666 B2 * | 8/2007 | Luo | ............................ | 330/296 |
| 7,332,968 B2 * | 2/2008 | Luo | ............................ | 330/296 |
| 7,579,914 B2 * | 8/2009 | Amano | ........................ | 330/296 |
| 7,616,060 B2 * | 11/2009 | Yamamoto et al. | .......... | 330/284 |
| 2003/0218500 A1 | 11/2003 | Yamamoto et al. | | |
| 2007/0053136 A1 | 3/2007 | Yamamoto et al. | | |

FOREIGN PATENT DOCUMENTS

| | | |
|---|---|---|
| JP | 2003-347870 A | 12/2003 |
| JP | 2007-74028 A | 3/2007 |

* cited by examiner

*Primary Examiner*—Henry K Choe
(74) *Attorney, Agent, or Firm*—Leydig, Voit & Mayer, Ltd.

(57) ABSTRACT

A power amplifier includes: an amplifying transistor; a bias circuit; a first diode; a second diode; a matching attenuating circuit; a first current mirror circuit; a serial resonant circuit, and a switch. In an amplification mode, the bias circuit supplies a bias current to the amplifying transistor, and the first current mirror circuit turns off the first and second diodes, and the switch. In an attenuation mode, the bias circuit supplies no bias current to the amplifying transistor, and the first current mirror circuit turns on the first and second diodes and the switch.

3 Claims, 7 Drawing Sheets

POWER AMPLIFIER

BACKGROUND OF THE INVENTION

1. Field of the Invention

The present invention relates to a power amplifier that amplifies RF signals in an amplification mode, and attenuates RF signals in an attenuation mode. More specifically, the present invention relates to a power amplifier that can lower minimum operating voltage, can reduce the impedance mismatch between input and output in the attenuation mode, can widen the degree of freedom in designing, and can suppress the degradation of distortion characteristics when a large power is inputted in the attenuation mode.

2. Background Art

In recent years, GaAs-HBT (hetero-junction bipolar transistor) power amplifiers have been widely used as power amplifiers for mobile phones that perform CDMA (code division multiple access) and power amplifiers for wireless LAN.

Since a GaAs-HBT requires no negative gate bias voltage, the GaAs-HBT can be operated by a single power source, and can obtain more even device characteristics than a GaAs-FET. Therefore, in recent years, the GaAs-HBT power amplifiers have been increasingly applied to GaAs-based power amplifiers for mobile phones or wireless LAN.

However, when an RF (high frequency) switch element is composed by a normal GaAs-HBT process, a switch that can turn the channel on only by applying gate voltage cannot be formed. Therefore, a switch using a base-collector junction diode (BC diode) having a junction close to a p-i-n junction is used (for example, refer to Japanese Patent Application Laid-Open No. 2003-347870). By inserting an attenuator using a base-collector diode in the amplification stage, the step attenuation function can be realized.

SUMMARY OF THE INVENTION

Other than the insertion of the attenuator having the step attenuation function as described above, the step attenuation function can be realized by providing a bypass circuit in the amplification stage. FIG. 13 is a block diagram showing a three-stage power amplifier wherein a bypass circuit is provided in the amplification stage. Bias circuits B1 to B3 for applying bias current to three stages of power amplifiers A1 to A3, respectively. Control voltage is supplied to bias circuits B1 and B3 from the control terminal Vref, and control voltage is supplied to the bias circuit B2 from the control terminal Vref2. A bypass circuit composed of a resistor Rf2 and a capacitor Cf2 is provided to the power amplifier A2 in the second stage.

FIG. 14 is a circuit diagram showing the power amplifier, the bias circuit, and the bypass circuit in the second stage shown in FIG. 13. The power amplifier has a collector power terminal Vcc2, an amplifying transistor Tr2, an inductor L, and a capacitor C. The bias circuit has a collector power terminal Vcb2, transistors Trb1 to Trb5, and resistors Rbb1 to Rbb7. The bypass circuit composed of a resistor Rf2 and a capacitor Cf2 is provided between the base and the collector of the amplifying transistor Tr2 in the power amplifier.

The operation of the circuit shown in FIG. 13 will be described. When a voltage of, for example, 3 V is applied to control terminals Vref and Vref2, since current is supplied to all the power amplifiers A1 to A3, the power amplifiers A1 to A3 perform normal amplifying operations. On the other hand, when 0 V is applied to the control terminal Vref2, since no bias current is supplied only to the power amplifier A2 in the second stage, the power amplifier A2 is turned off, and RF signals are transferred to the power amplifier A3 in the third stage through the bypass circuit (resistor Rf2 and capacitor Cf2). At this time, by setting the resistance value of the resistor Rf2 and the capacitance value of the capacitor Cf2 to appropriate values, RF signals are undergone predetermined attenuation.

For example, when a voltage of 3 V is applied to the control terminal Vref2, if the gain of the power amplifier A2 is 10 dB, the gain of the power amplifiers A1 and A3 is 20 dB; and when a voltage of 0 V is applied to the control terminal Vref2, if the gain of the signals passing through the bypass circuit (resistor Rf2 and capacitor Cf2) is −10 dB, the circuit shown in FIG. 13 can realize two states of a gain of 30 dB and a gain of 10 dB corresponding to the voltage applied to the control terminal Vref2. In other words, the power amplifier A2 and the bypass circuit in the second stage can realize the step attenuation function of 0 dB and 20 dB.

Since the circuits shown in FIGS. 13 and 14 including the bias circuit can be all operated by a voltage of at least 2 Vbi, the minimum operating voltage is 2 Vbi (=2.4 to 2.6 V), operation at 3 V is feasible. In the attenuation mode, since the power amplifier A2 in the second stage is turned off, current consumption in the attenuation mode can be less than the circuit wherein an attenuator having a step attenuating function is inserted in the amplification stage. However, even if the power amplifier A2 is turned off, when large power is inputted from the power amplifier A1 in the first stage, the amplifying transistor Tr2 is turned on from the "off" state by the self-bias effect of the amplifying transistor Tr2. This change corresponds to the state wherein insertion loss is changed. Therefore, the allowable input power that can maintain the attenuation state depends on the size of the amplifying transistor Tr2 (total emitter junction area) and turned-off base bias voltage. On the other hand, in the circuit wherein the attenuator having the step attenuating function is inserted in the amplification stages, since all the power amplifiers are turned on, the allowable input power depends only on the passing state of the attenuator and the bias current and bias voltage in the attenuation state.

The circuits shown in FIGS. 13 and 14 have the following problems. First, when the power amplifier A2 in the second stage is turned off, significant impedance mismatch is easily caused between the first and second stages and between the second and third stages. This is because the matching circuits between the first and second stages and between the second and third stages are composed only of passive elements; and therefore, impedance matching between stages is not easy in both the amplification mode and the attenuation mode. If impedance mismatch between stages is significant, the oscillation of the amplifier or the occurrence of reflection gain is easily caused when load is varied, which is unfavorable for operation.

Since the resistor Rf2 and the capacitor Cf2 operate as a feedback circuit in the amplification mode, the power amplifier and the bypass circuit cannot be independently designed. In other words, the transistor size in the power amplifier or the attenuation quantity of the bypass circuit cannot be freely designed.

To solve the above-described problem, the present inventors contrived the circuit shown in FIG. 15. FIG. 15 is a circuit diagram showing a reference example of a power amplifier. The base of an amplifying transistor Tr2 that amplifies RF signals is connected to an input terminal IN via an input matching circuit M1 and a capacitor C1, the collector thereof is connected to an output terminal OUT via an output matching circuit M2 and a capacitor C2, and the emitter thereof is grounded. An inductor L is provided between a collector power terminal Vcc2 and the output matching circuit M2. The bias circuit B2 supplies bias current to the base of the amplifying transistor Tr2 corresponding to the voltage applied to a control terminal Vref2.

In addition to the basic configuration of the amplifier, a matching attenuation circuit MA, BC diodes Da1 and Da2, capacitors Ca1 and Ca2, inductors La1 and La2, a current mirror circuit CM1, a resistor Ra1, and a control terminal Vcnt are provided. The matching attenuation circuit MA reduces impedance mismatch between the input terminal IN side and the output terminal OUT side, and attenuates RF signals. The current mirror circuit CM1 supplies current Ia2 to the BC diodes Da1 and Da2 corresponding to reference current Icnt to drive the BC diodes Da1 and Da2.

The operation of the circuit shown in FIG. 15 will be described. For example, when 3 V is applied to the control terminal Vref2, 3 V is applied to the collector power terminal Vcc2, and 0 V is applied to the control terminal Vcnt (amplification mode), the bias circuit B2 supplies bias current to the amplifying transistor Tr2. Then, since reference current Icnt does not flow, bias current Ia2 also does not flow in the BC diodes Da1 and Da2. Therefore, RF signals pass through a path 1, and are amplified by the amplifying transistor Tr2. At this time, since BC diodes Da1 and Da2 are turned off, the leakage of RF signals into a path 2 is extremely little.

On the other hand, when 0 V is applied to the control terminal Vref2, and 3 V is applied to the control terminal Vcnt (attenuation mode), the bias circuit B2 does not supply bias current to the amplifying transistor Tr2. Then, since reference current Icnt flows, bias current Ia2 also flows in the BC diodes Da1 and Da2. In other words, the current mirror circuit CM1 turns the BC diodes Da1 and Da2 on. Therefore, RF signals pass through the path 2, and are attenuated by the matching attenuation circuit MA.

In the circuit shown in FIG. 15, since the matching attenuation circuit MA reduces impedance mismatch between the input terminal IN side and the output terminal OUT side, impedance mismatch between input and output in the attenuation mode can be reduced. Furthermore, since the BC diodes Da1 and Da2 are turned off in the amplification mode, the effect of the bypass circuit to the power amplifier can be significantly reduced. Thereby, the power amplifier and the bypass circuit can be independently designed. In other words, the transistor size in the power amplifier or the attenuation quantity of the bypass circuit can be freely designed.

However, in the circuit shown in FIG. 15, even if the base voltage is 0 V in terms of DC, and the amplifying transistor Tr2 is turned off (attenuation mode), there is a problem wherein when large power is inputted in the amplifying transistor Tr2, collector current flows due to the self-bias effect, and signal distortion rapidly increases. FIG. 16 is a graph showing output characteristics of the circuit shown in FIG. 15 in the attenuation mode. The distortion of the signals is represented by tertiary intermodulation distortion Pim3. At the point A where the collector current Ic2 rose from 0 mA, rapid increase in signal distortion was observed. Input power at the point A little depended on the total emitter area of the amplifying transistor Tr2, and was about 15 dBm to 17 dBm when the base voltage was 0 V.

To solve the above-described problems, it is an object of the present invention to obtain a power amplifier that can lower minimum operating voltage, can reduce the impedance mismatch between input and output in the attenuation mode, can widen the degree of freedom in designing, and can suppress the degradation of distortion characteristics when a large power is inputted in the attenuation mode.

According to one aspect of the present invention, a power amplifier comprises: an amplifying transistor for amplifying RF signals, whose base is connected to an input terminal and whose collector is connecter to an output terminal; a bias circuit for supplying bias current to the base of said amplifying transistor; a first diode whose cathode is connected to said input terminal via a first capacitor; a second diode whose anode is connected to said output terminal via a second capacitor, and connected to a first power terminal via a first inductor; a matching attenuating circuit connected between the anode of said first diode and the cathode of said second diode, for reducing impedance mismatch in the side of said input terminal and the side of said output terminal, and attenuating said RF signals; a first current mirror circuit connected to the cathode of said first diode via a second inductor, for driving said first and second diodes; a serial resonant circuit connected between the base of said amplifying transistor and a grounding point, whose resonance frequency is set in the operating frequency band of said amplifying transistor, and a switch connected between said serial resonant circuit and the grounding point; wherein: in an amplification mode, said bias circuit supplies bias current to said amplifying transistor, and said first current mirror circuit turns off said first and second diodes, and turns off said switch; and in an attenuation mode, said bias circuit supplies no bias current to said amplifying transistor, and said first current mirror circuit turns said first and second diodes on, and turns said switch on.

According to the present invention, a power amplifier that can lower minimum operating voltage, can reduce the impedance mismatch between input and output in the attenuation mode, can widen the degree of freedom in designing, and can suppress the degradation of distortion characteristics when a large power is inputted in the attenuation mode can be obtained.

Other and further objects, features and advantages of the invention will appear more fully from the following description.

DETAILED DESCRIPTION OF THE PREFERRED EMBODIMENTS

First Embodiment

Figure 1:
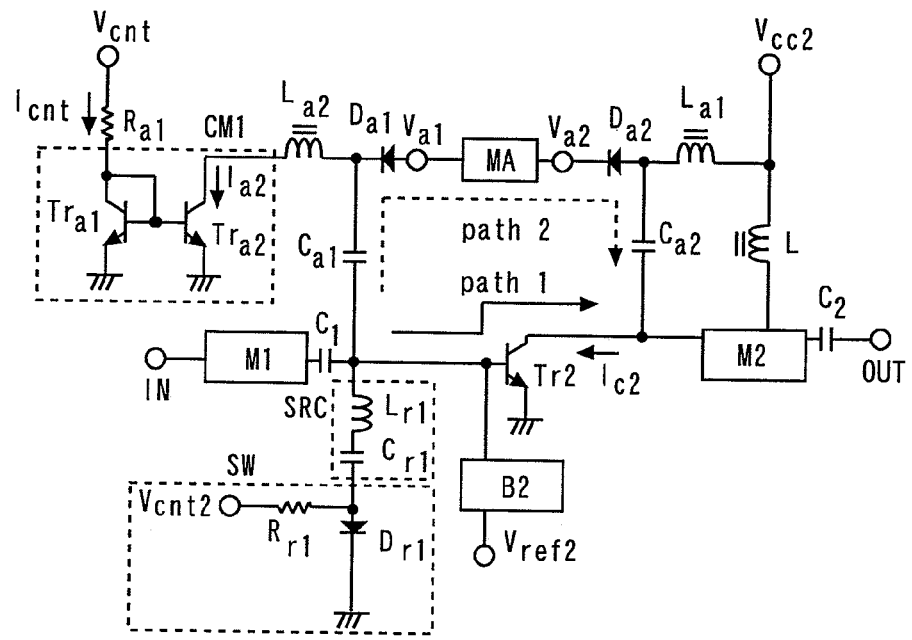
FIG. 1 is a circuit diagram showing a power amplifier according to a first embodiment of the present invention.

FIG. 1 is a circuit diagram showing a power amplifier according to a first embodiment of the present invention. The power amplifier is formed using a GaAs-HBT process.

The base of an amplifying transistor Tr2 that amplifies RF signals is connected to an input terminal IN via an input matching circuit M1 and a capacitor C1, the collector thereof is connected to an output terminal OUT via an output matching circuit M2 and a capacitor C2, and the emitter thereof is grounded. An inductor L is provided between a collector power terminal Vcc2 and the output matching circuit M2. A bias circuit B2 supplies bias current to the base of the amplifying transistor Tr2 corresponding to voltage applied to a control terminal Vref2.

The cathode of a BC diode Da1 (first diode) is connected to the input terminal IN via a capacitor Ca1 (first capacitor), the capacitor C1, and the input matching circuit M1. The anode of a BC diode Da2 (second diode) is connected to the output terminal OUT via a capacitor Ca2 (second capacitor), the output matching circuit M2, and the capacitor C2, and also connected to the collector power terminal Vcc2 (first power terminal) via an inductor La1 (first inductor).

Figure 2:
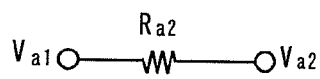
FIG. 2 is a circuit diagram showing a first example of the matching attenuation circuit.

A matching attenuation circuit MA is connected between the anode of the BC diode Da1 and the cathode of the BC diode Da2. The matching attenuation circuit MA has a terminal Va1 connected to the anode of the BC diode Da1, and a terminal Va2 connected to the cathode of the BC diode Da2. FIG. 2 is a circuit diagram showing a first example of the matching attenuation circuit. A resistor Ra2 that sets attenuation quantity is connected between the terminal Va1 and the terminal Va2. The matching attenuation circuit MA reduces the mismatch of impedances in the input terminal IN side and the output terminal OUT side corresponding to the resistance value of the resistor Ra2, and attenuates the RF signals.

A current mirror circuit CM1 (first current mirror circuit) is connected to the cathode of the BC diode Da1 via an inductor La2 (second inductor). A resistor Ra1 (first resistor) generates reference current Icnt of the current mirror circuit CM1 corresponding to voltage applied to a control terminal Vcnt. The current mirror circuit CM1 has transistors Tra1 and Tra2. The base and the collector of the transistor Tra1 are connected to a resistor Ra1, and the emitter thereof is grounded. The base of the transistor Tra2 is connected to the base of the transistor Tra1, the collector thereof is connected to the inductor La2, and the emitter thereof is grounded. The current mirror circuit CM1 flows current Ia2 to BC diodes Da1 and Da2 corresponding to the reference current Icnt to drive the BC diodes Da1 and Da2.

A serial resonance circuit SRC is connected between the base of the amplifying transistor Tr2 and a grounding point. The serial resonance circuit SRC has an inductor Lr1 and a capacitor Cr1 connected in series. The resonance frequency of the serial resonance circuit SRC is set to the operating frequency band of the amplifying transistor Tr2.

A switch SW is connected between the serial resonance circuit SRC and a grounding point. The switch SW has a BC diode Dr1 (third diode) whose cathode is connected to the grounding point, and a resistor Rr1 connected between the anode of the BC diode Dr1 and the control terminal Vcnt2.

The operation of the circuit shown in FIG. 1 will be described. For example, when 3 V is applied to the control terminal Vref2, 3 V is applied to the collector power terminal Vcc2, and 0 V is applied to the control terminal Vcnt (amplification mode), the bias circuit B2 supplies bias current to the amplifying transistor Tr2. Then, since reference current Icnt does not flow, bias current Ia2 also does not flow in the BC diodes Da1 and Da2. In other words, the current mirror circuit CM1 turns the BC diodes Da1 and Da2 off. Therefore, RF signals pass through a path 1, and are amplified by the amplifying transistor Tr2. At this time, since BC diodes Da1 and Da2 are turned off, the leakage of RF signals into a path 2 is extremely little.

On the other hand, when 0 V is applied to the control terminal Vref2, and 3 V is applied to the control terminal Vcnt (attenuation mode), the bias circuit B2 does not supply bias current to the amplifying transistor Tr2. Then, since reference current Icnt flows, bias current Ia2 also flows in the BC diodes Da1 and Da2. In other words, the current mirror circuit CM1 turns the BC diodes Da1 and Da2 on. Therefore, RF signals pass through the path 2, and are attenuated by the matching attenuation circuit MA. If the inductance values of the inductors La1 and La2 are adequately set, change in reflection loss of the amplification and attenuation operations viewed from the input terminal IN and the output terminal OUT to the amplifying transistor Tr2 can be reduced.

As described above, since the matching attenuation circuit MA reduces the mismatch of impedance in the input terminal IN side and the output terminal OUT side, the input-output mismatch of impedance in the attenuation mode can be reduced.

Since the BC diodes Da1 and Da2 are turned off in the amplification mode, the effect of bypass circuits to the power amplifier can be significantly reduced. Thereby, the power amplifier and the bypass circuits can be independently designed. Specifically, the transistor size in the power amplifier (total emitter area) or the attenuation quantity of the bypass circuits can be freely designed.

Figure 14:
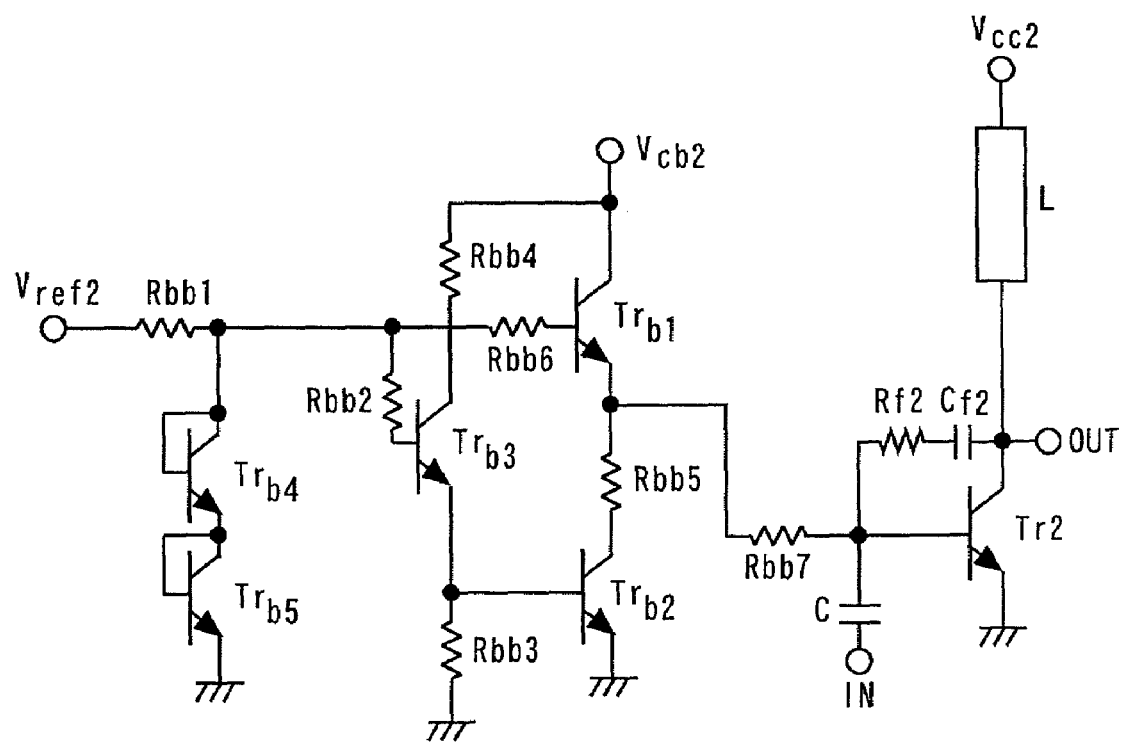
FIG. 14 is a circuit diagram showing the power amplifier, the bias circuit, and the bypass circuit in the second stage shown in FIG. 13.

Also since the BC diodes Da1 and Da2 are driven by the current mirror circuit CM1, the "ON" and "OFF" of the BC diodes Da1 and Da2 (i.e. the attenuation mode and the amplification mode) can be switched by a positive voltage and 0 V applied to the control terminal Vcnt. Since the minimum operating voltage is determined by the sum (2 Vbi+Vce) of the voltage Vbi of the two BC diodes Da1 and Da2, and the "ON" voltage Vce between the collector and the emitter of the amplifying transistor Tr2, the minimum operating voltage can be lowered to about 2.6 V to 2.8 V. Therefore, the power amplifier can be operated even at a power voltage of 3.3 V. However, since the bypass circuit is operated by flowing current to the BC diodes Da1 and Da2, the operating current in the attenuation mode increases compared with a conventional circuit (FIG. 14).

Figure 15:
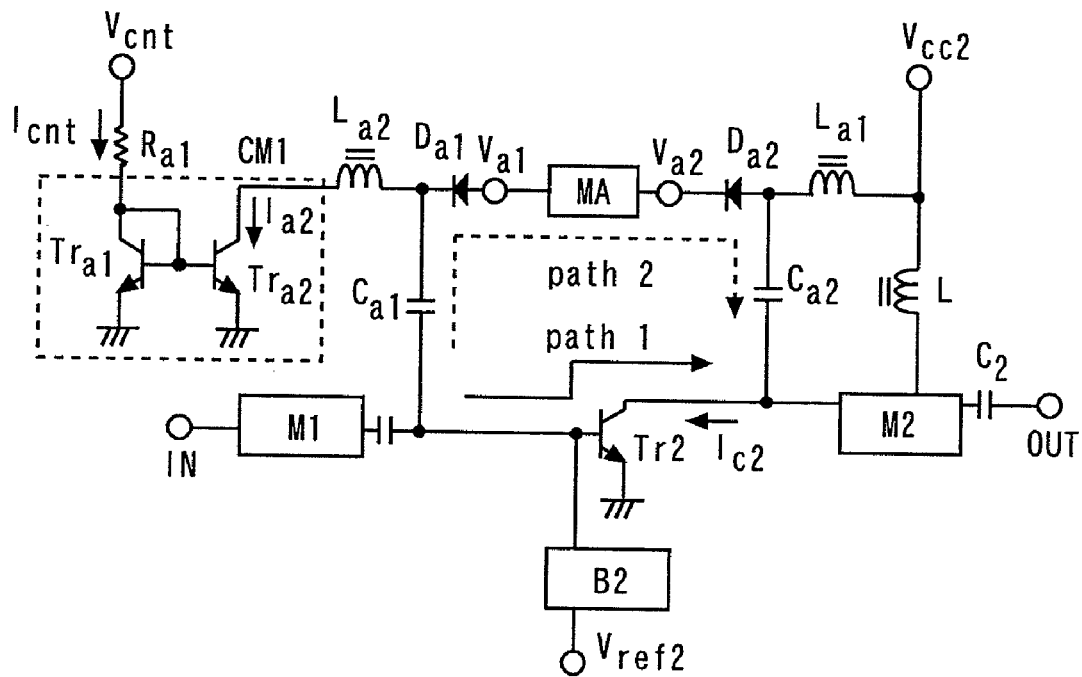
FIG. 15 is a circuit diagram showing a reference example of a power amplifier.
Figure 16:
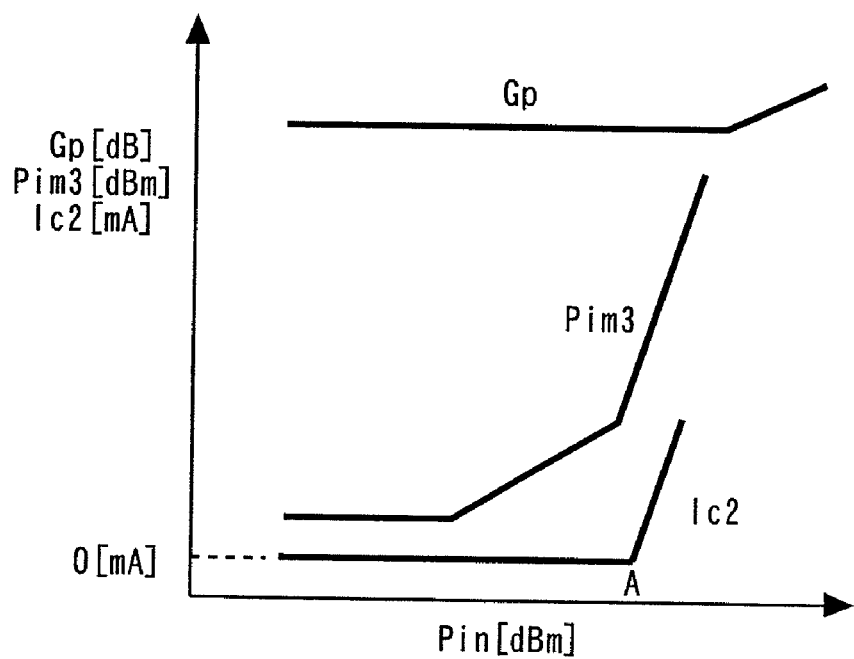
FIG. 16 is a graph showing output characteristics of the circuit shown in FIG. 15 in the attenuation mode.

Although the above-described operation and effect are the same as the operation and effect of the circuit shown in FIG. 15, in the first embodiment, the following operation is further performed. In the amplification mode, a low-level voltage (for example, 0 V) is applied to the control terminal Vcnt2. Thereby, the BC diode Dr1 is turned off, and the switch SW is turned off. Therefore in the amplification mode, not only the bypass path, but also the serial resonance circuit SRC is not also operated, and the serial resonance circuit SRC affects hardly RC signals.

On the other hand, in the attenuation mode, a high-level voltage (for example, 3 V) is applied to the control terminal Vcnt2. Thereby, the BC diode Dr1 is turned on, and the switch SW is turned on. Therefore, the serial resonance circuit SRC is operated to suppress the RF signals inputted in the base of the amplifying transistor Tr2. In the attenuation mode, the RF signals toward the bypass path is simultaneously affected by the serial resonance circuit SRC, by adjusting the circuit constants of the matching attenuation circuit MA provided in the bypass path or the capacitance values of the capacitors Ca1 and Ca2, the attenuation mode can be realized without worsening refection loss.

Figure 3:
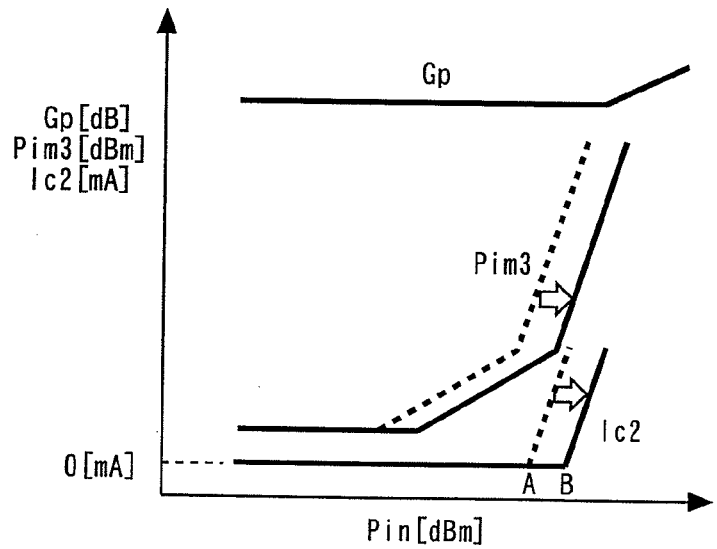
FIG. 3 is a graph showing output characteristics of the circuit shown in FIG. 1 in the attenuation mode.

FIG. 3 is a graph showing output characteristics of the circuit shown in FIG. 1 in the attenuation mode. The output characteristics of the circuit shown in FIG. 1 are shown by solid lines; and for reference, the output characteristics of the circuit shown in FIG. 15 are shown by broken lines. In the circuit shown in FIG. 1, the input power level for raising the collector current Ic2 is about 2 to 3 dB higher compared with the circuit shown in FIG. 15 (shift from the point A to the point B). Thereby, the degradation of distortion characteristics (Pim3) when large power is inputted in the attenuation mode can be suppressed. By applying sufficient bias current to the BC diodes Da1 and Da2, the distortion generated in the bypass path side is made not to affect the degradation of the point A and the point B shown in FIG. 3.

Figure 4:
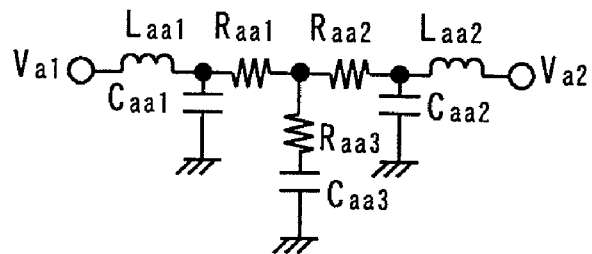
FIG. 4 is a circuit diagram showing a second example of a matching attenuation circuit.
Figure 5:
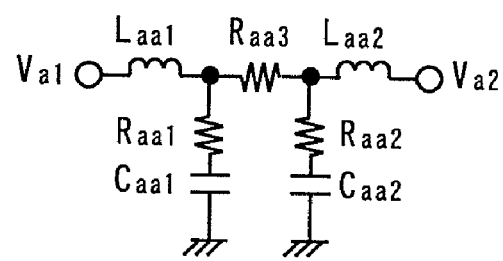
FIG. 5 is a circuit diagram showing a third example of a matching attenuation circuit.
Figure 6:
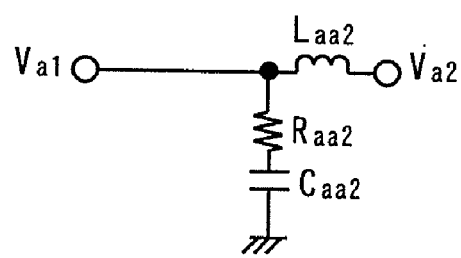
FIG. 6 is a circuit diagram showing a fourth example of a matching attenuation circuit.

The matching attenuation circuit MA may be any of circuit configurations shown in FIGS. 4 to 6. FIG. 4 is a circuit diagram showing a second example of a matching attenuation circuit. Between a terminal Va1 and a terminal Va2, an inductor Laa1, a resistor Raa1, a resistor Raa2, and an inductor Laa2 are connected in series. Between the connecting point of the inductor Laa1 to the resistor Raa1 and a grounding point, a capacitor Caa1 is connected. Between the connecting point of the resistor Raa1 to the resistor Raa2 and a grounding point, a resistor Raa3 and a capacitor Caa3 are connected in series. Between the connecting point of the resistor Raa2 to the inductor Laa2 and a grounding point, a capacitor Caa2 is connected.

FIG. 5 is a circuit diagram showing a third example of a matching attenuation circuit. Between a terminal Va1 and a terminal Va2, an inductor Laa1, a resistor Raa3, and an inductor Laa2 are connected in series. Between the connecting point of the inductor Laa1 to the resistor Raa3 and a grounding point, a resistor Raa1 and a capacitor Caa1 are connected in series. Between the connecting point of the resistor Raa3 to the inductor Laa2, a resistor Raa2 and a capacitor Caa2 are connected in series.

FIG. 6 is a circuit diagram showing a fourth example of a matching attenuation circuit. Between a terminal Va1 and a terminal Va2, an inductor Laa2 is connected. Between an end of the inductor Laa2 and a grounding point, a resistor Raa2 and a capacitor Caa2 are connected in series.

By making the matching attenuation circuit MA be any of circuit configurations shown in FIGS. 4 to 6, the both functions of impedance matching and attenuation in the attenuation mode can be more surely realized than the case of the circuit configuration shown in FIG. 2.

Second Embodiment

Figure 7:
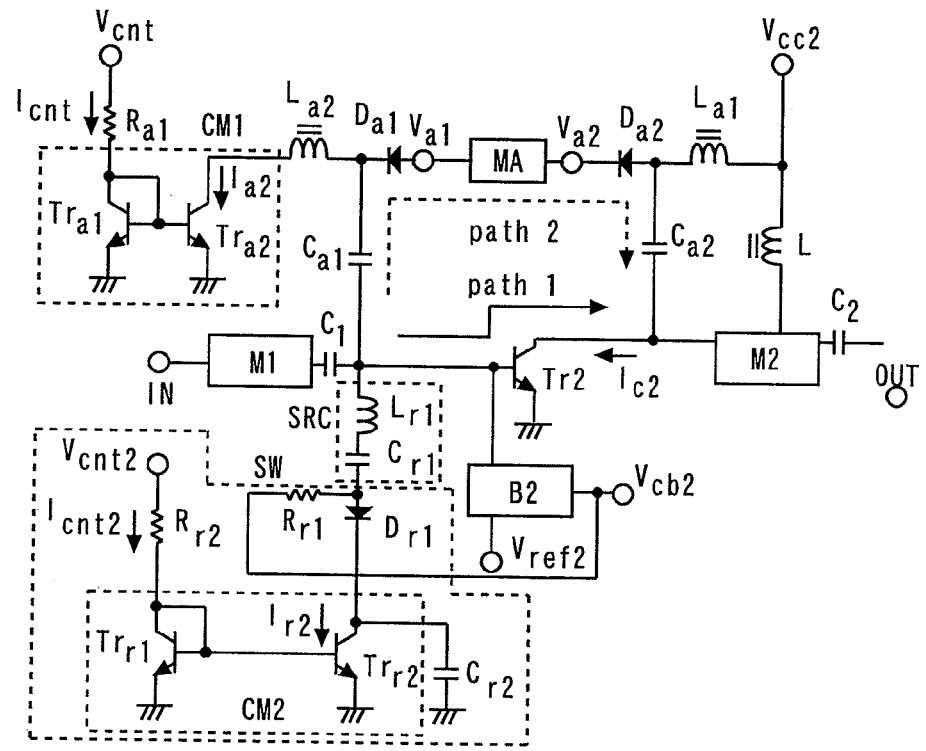
FIG. 7 is a circuit diagram showing a power amplifier according to a second embodiment of the present invention.

FIG. 7 is a circuit diagram showing a power amplifier according to a second embodiment of the present invention. Components same as in the first embodiment are denoted by the same reference characters and numerals, and the description thereof will be omitted.

Other than the configuration of the switch SW, the second embodiment is identical to the first embodiment. The switch SW has a BC diode Dr1 (third diode), resistors Rr1 and Rr2, a current mirror circuit CM2 (second current mirror circuit), and a capacitor Cr2. The anode of the BC diode Dr1 is connected to a serial resonance circuit SRC. The resistor Rr2 is connected between the anode of the BC diode Dr1 and the power terminal Vcb2 of the bias circuit B2 (second power terminal). The current mirror circuit CM2 is connected to the cathode of the BC diode Dr1, and drives the BC diode Dr1.

The resistor Rr1 forms the reference current Icnt2 of the current mirror circuit CM2 corresponding to the voltage applied to the control terminal Vcnt2. The current mirror circuit CM2 has transistors Trr1 and Trr2. The base and the collector of the transistor Trr1 are connected to a resistor Rr1, and the emitter thereof is grounded. The base of the transistor Trr2 is connected to the base of the transistor Trr1, the collector thereof is connected to the cathode of the BC diode Dr1, and the emitter thereof is grounded. A capacitor Cr2 is connected between the collector of the transistor Trr2 and a grounding point. The capacitor Cr2 is a bypass capacitor of the current mirror circuit CM2.

The current mirror circuit CM2 flows current Ir2 to the BC diode Dr1 corresponding to the reference current Icnt2, to drive the BC diode Dr1. Here, in the amplification mode, the current mirror circuit CM2 turns the BC diode Dr1 off, and in the attenuation mode, the current mirror circuit CM2 turns the BC diode Dr1 on. Thereby, the equivalent effect as in the first embodiment can be obtained.

Since a bias current is supplied to the BC diode Dr1 using the power terminal Vcb2 of the bias circuit B2, the current flowed to the control terminal Vcnt2 can be reduced more than in the first embodiment. Practically, the current is often supplied to the control terminal Vcnt2 using a circuit having a small current capacity, the reduction of current is important for the commercialization of products. Otherwise, the equivalent effect as in the first embodiment can be obtained.

Third Embodiment

Figure 8:
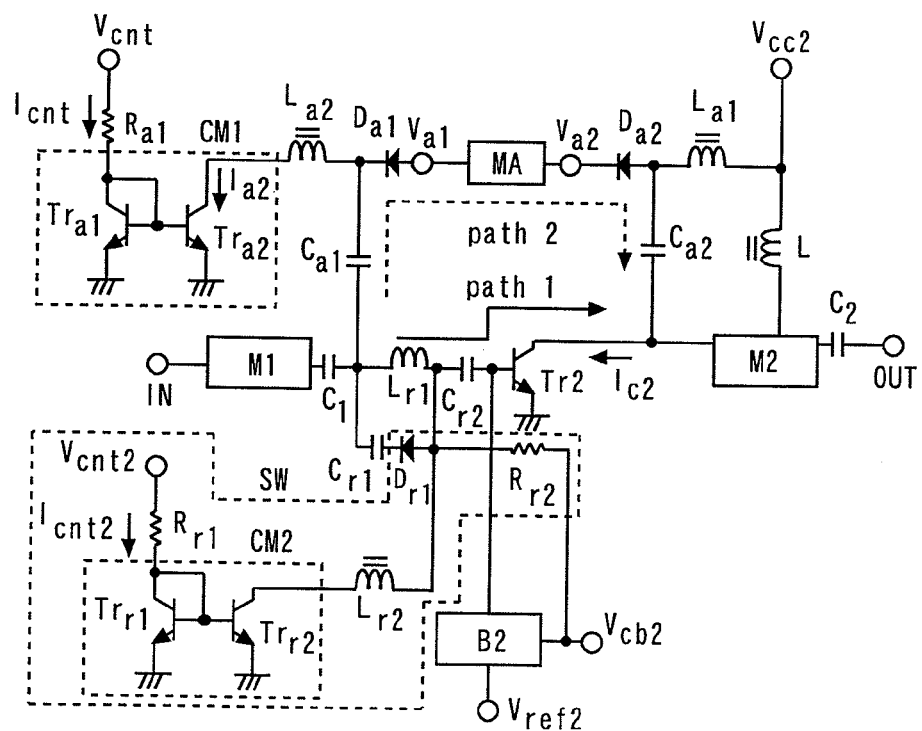
FIG. 8 is a circuit diagram showing a power amplifier according to a third embodiment of the present invention.

FIG. 8 is a circuit diagram showing a power amplifier according to a third embodiment of the present invention. Components same as in the first or second embodiment are denoted by the same reference characters and numerals, and the description thereof will be omitted.

An inductor Lr1 (third inductor) and a capacitor Cr2 (third capacitor) are connected in series between a capacitor C1 and the base of an amplifying transistor Tr2. A capacitor Cr1 (fourth capacitor) is connected in parallel to the inductor Lr1. A switch SW is connected in parallel to the inductor Lr1, and connected in series to the capacitor Cr1.

The inductor Lr1 and the capacitor Cr2 compose a serial resonance circuit whose resonance frequency is set in the operating frequency band of the amplifying transistor Tr2. The inductor Lr1 and the capacitor Cr1 compose a parallel resonance circuit whose resonance frequency is set in the operating frequency band of the amplifying transistor Tr2.

The switch SW has a BC diode Dr1 (third diode), resistors Rr1 and Rr2, a current mirror circuit CM2 (second current mirror circuit), and an inductor Lr2. The cathode of the BC diode Dr1 is connected to the capacitor Cr1, and the anode thereof is connected to the inductor Lr1 and the capacitor Cr2. The resistor Rr2 is connected between the anode of the BC diode Dr1 and a power terminal Vcb2 (second power terminal) of a bias circuit B2. The current mirror circuit CM2 is connected to the anode of the BC diode Dr1 via the inductor Lr2 to drive the BC diode Dr1. The resistor Rr1 generates the reference current Icnt2 of the current mirror circuit CM2 corresponding to voltage applied to a control terminal Vcnt2.

In the amplification mode, a low-level voltage (for example, 0 V) is applied to the control terminal Vcnt2, and the current mirror circuit CM2 turns the BC diode Dr1 off, and turns the switch SW off. Therefore, no RF signals flow in the capacitor Cr1. Since the inductor Lr1 serially resonates with the capacitor Cr2 in the operating frequency band, RF signals inputted from the input terminal IN are efficiently transmitted to the base of the amplifying transistor Tr2.

On the other hand, in the attenuation mode, a high-level voltage (for example, 3 V) is applied to the control terminal Vcnt2, and the current mirror circuit CM2 turns the BC diode Dr1 on, and turns the switch SW on. Therefore, RF signals flow in the capacitor Cr1. Since the inductor Lr1 resonates in parallel with the capacitor Cr1 in the operating frequency band, RF signals inputted in the base of the amplifying transistor Tr2 are suppressed. Thereby, as in the first embodiment, in the attenuation mode, the degradation of distortion characteristics when a large power is inputted can be suppressed.

Also since bias current is supplied to the BC diode Dr1 using the power terminal Vcb2 of the bias circuit B2, the current flowed in the control terminal Vcnt2 can be reduced as in the second embodiment. Otherwise, the equivalent effect as in the first embodiment can be obtained.

Fourth Embodiment

Figure 9:
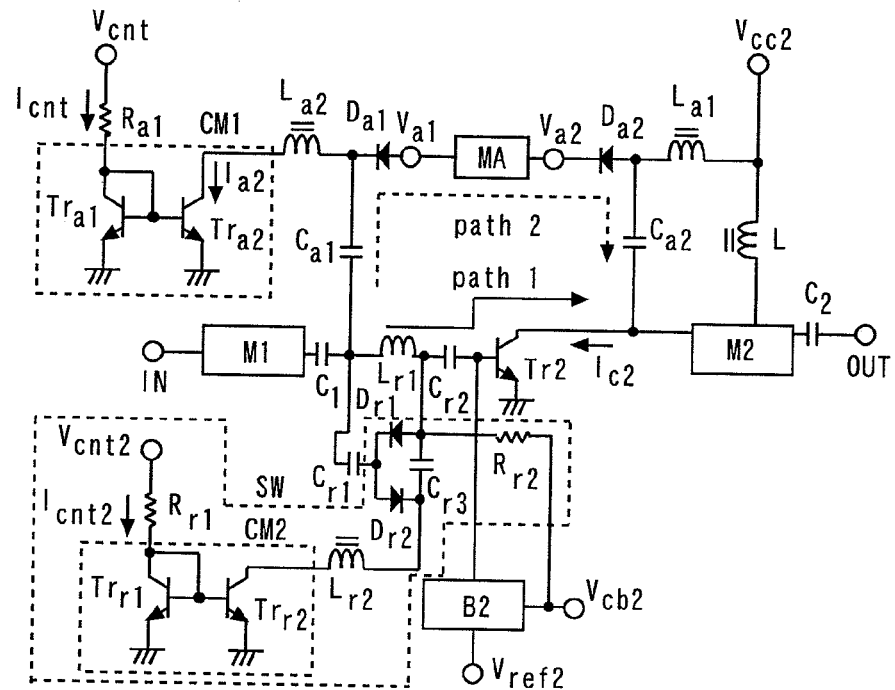
FIG. 9 is a circuit diagram showing a power amplifier according to a fourth embodiment of the present invention.

FIG. 9 is a circuit diagram showing a power amplifier according to a fourth embodiment of the present invention. Components same as in the first embodiment are denoted by the same reference characters and numerals, and the description thereof will be omitted.

The difference from the third embodiment is that the switch SW is an AC-coupling stack type diode switch further having a BC diode Dr2 (fourth diode) and a capacitor Cr3 (fifth capacitor). The anode of the BC diode Dr2 is connected to the cathode of the BC diode Dr1 and a capacitor Cr1. A capacitor Cr3 is connected between the cathode of the BC diode Dr2 and the anode of the BC diode Dr1.

The allowable transmitting power of the AC-coupling stack type diode switch is four-fold the allowable transmitting power of one diode in the same bias current condition. Therefore, since the bias current of the BC diode Dr1 in the attenuation mode can be reduced to a half the bias current in the third embodiment, current flowed in the control terminal Vcnt2 can also be reduced. Otherwise, the equivalent effect as in the third embodiment can be obtained.

Fifth Embodiment

Figure 10:
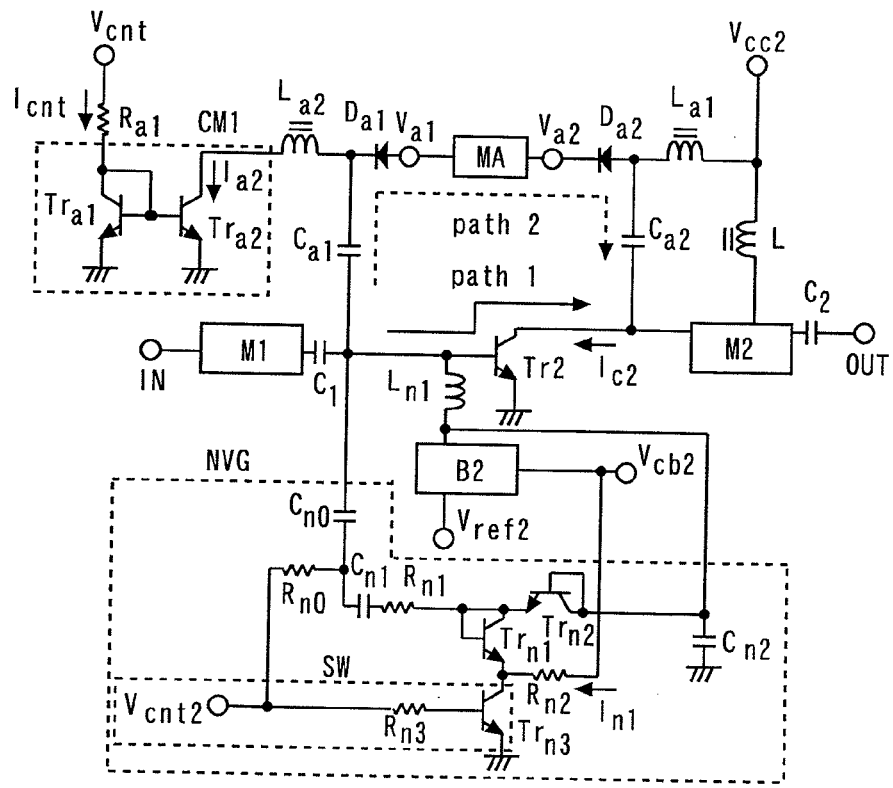
FIG. 10 is a circuit diagram showing a power amplifier according to a fifth embodiment of the present invention.

FIG. 10 is a circuit diagram showing a power amplifier according to a fifth embodiment of the present invention. Components same as in the first embodiment are denoted by the same reference characters and numerals, and the description thereof will be omitted.

Difference from the first embodiment is that a negative voltage generating circuit NVG is connected to the base of the amplifying transistor Tr2, in place of the serial resonance circuit SRC.

The negative voltage generating circuit NVG has capacitors Cn0 and Cn1 (third capacitor), a transistor Trn1 (first transistor), resistors Rn0, Rn1, and Rn2, a switch SW, a transistor Trn2 (second transistor), and a capacitor Cn2 (fourth capacitor). The switch SW has a transistor Trn3 whose base is connected to a control terminal Vcnt2 via the resistor Rn3, and whose emitter is grounded.

The capacitor Cn0 is connected to an input terminal IN via an input matching circuit M1 and a capacitor C1. The capacitor Cn1 and the resistor Rn1 are connected in series to the capacitor Cn0. An end of the resistor Rn0 is connected to the control terminal Vcnt2, and the other end is connected to the capacitors Cn0 and Cn1.

The base and the collector of the transistor Trn1 are connected to the capacitor Cn0 via the capacitor Cn1 and the resistor Rn1. The resistor Rn2 is connected between the emitter of the transistor Trn1 and a power terminal Vcb2 (second power terminal) of a bias circuit B2. The switch SW is connected between the emitter of the transistor Trn1 and a grounding point.

The emitter of the transistor Trn2 is connected to the capacitor Cn1 via the resistor Rn1. An end of the capacitor Cn2 is connected to the base and the collector of the transistor Trn2, and also connected to the base of the amplifying transistor Tr2 via an inductor Ln1 (fourth inductor). The other end of the capacitor Cn2 is grounded.

The operation of the circuit shown in FIG. 10 will be described. In the amplification mode, a low-level voltage (for example, 0 V) is applied to the control terminal Vcnt2, the switch SW is turned off, and the negative voltage generating circuit NVG does not operate.

On the other hand, in the attenuation mode, a high-level voltage (for example, 3 V) is applied to the control terminal Vcnt2, and the switch SW is turned on. When RF signals exceeding the base-emitter voltage of the transistor Trn1, charge in capacitors Cn0 and Cn1 is reversed, and charged in the capacitor Cn2. Thereby, the negative voltage generating circuit NVG applies negative bias voltage to the base of the amplifying transistor Tr2. Therefore, due to the self-bias effect of the amplifying transistor Tr2, the level of input power so that collector current Ic2 flows is elevated. Thereby, in the attenuation mode, the degradation of distortion characteristics when large power is inputted can be suppressed in the same manner as in the first embodiment. In simulation, an improvement effect of about 4 to 5 dB was confirmed. Otherwise, the equivalent effect as in the first embodiment can be obtained.

Sixth Embodiment

Figure 11:
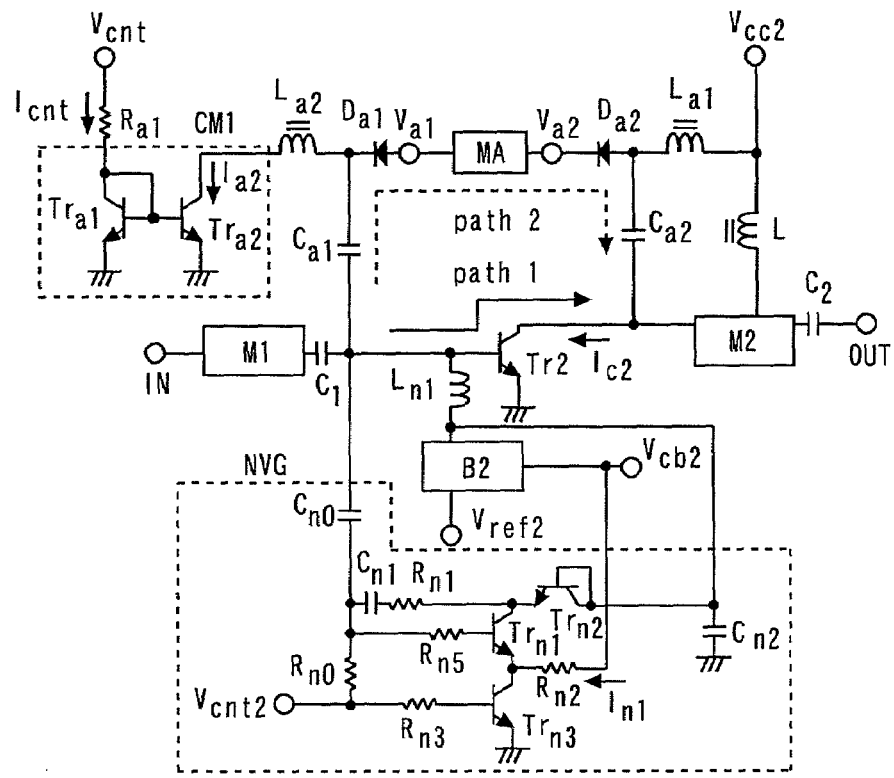
FIG. 11 is a circuit diagram showing a power amplifier according to a sixth embodiment of the present invention.

FIG. 11 is a circuit diagram showing a power amplifier according to a sixth embodiment of the present invention. Components same as in the first embodiment are denoted by the same reference characters and numerals, and the description thereof will be omitted.

Difference from the fifth embodiment is that the base of the transistor Trn1 is connected between capacitors Cn0 and Cn1 via a resistor Rn5. Thereby, since the on-off operation of the transistor Trn1 is performed in conjunction with inputted RF signals, the same input power can generate larger negative bias voltage than in the fifth embodiment. Otherwise, the equivalent effect as in the fifth embodiment can be obtained.

Seventh Embodiment

Figure 12:
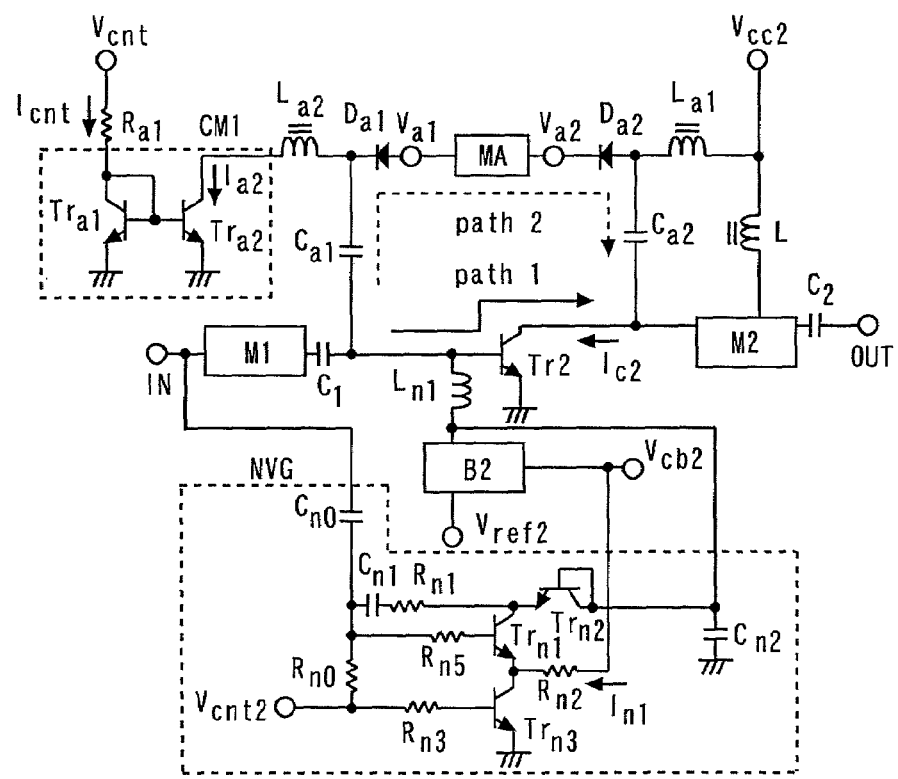
FIG. 12 is a circuit diagram showing a power amplifier according to a seventh embodiment of the present invention.

FIG. 12 is a circuit diagram showing a power amplifier according to a seventh embodiment of the present invention. Components same as in the first embodiment are denoted by the same reference characters and numerals, and the description thereof will be omitted.

Difference from the sixth embodiment is that the capacitor Cn0 of the negative voltage generating circuit NVG is directly connected to the input terminal IN without the intervention of the capacitor C1. Since the negative voltage generating circuit NVG can generate larger negative voltage as voltage having larger amplitude is applied, larger input amplitude can be inputted in the negative voltage generating circuit NVG when the capacitor Cn0 is directly connected to the input terminal IN having a higher impedance than the vicinity of the base of the amplifying transistor Tr2 having a low impedance. Thereby, the same input power can generate larger negative bias voltage than in the sixth embodiment. Otherwise, the equivalent effect as in the sixth embodiment can be obtained.

Figure 13:
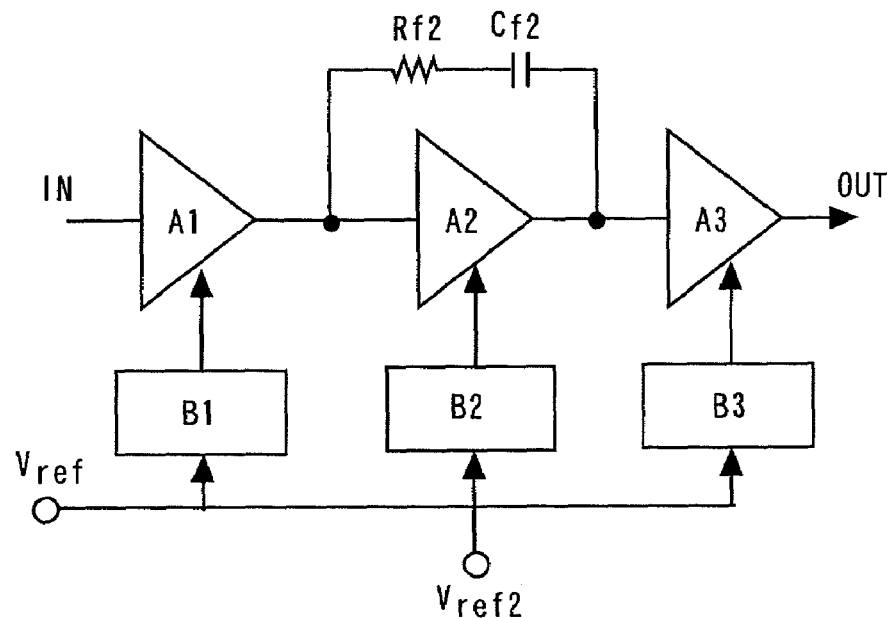
FIG. 13 is a block diagram showing a three-stage power amplifier wherein a bypass circuit is provided in the amplification stage.

Power amplifiers according to the above-described first to seventh embodiments can be applied to the power amplifier, the bias circuit, and the bypass circuit in the second stage in FIG. 13. Thereby, when the power amplifier A2 is turned off, the degradation of distortion characteristics when a large power is inputted from the power amplifier A1 in the first stage can be suppressed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-154492, filed on Jun. 12, 2008 including specification, claims, drawings and summary, on which the Convention priority of the present application is based, are incorporated herein by reference in its entirety.

What is claimed is
1. A power amplifier comprising:
an amplifying transistor for amplifying RF signals, having a base connected to an input terminal and a collector connected to an output terminal;
a bias circuit for supplying a bias current to the base of said amplifying transistor;
first and second capacitors and first and second inductors;
a first diode having an anode and a cathode, the cathode being connected to the input terminal via said first capacitor;
a second diode having an anode and a cathode, the anode being connected to the output terminal via said second capacitor, and connected to a first power terminal via said first inductor;
a matching attenuating circuit connected between the anode of said first diode and the cathode of said second diode, for reducing impedance mismatch at the input terminal and at the output terminal, and attenuating the RF signals;
a first current mirror circuit connected to the cathode of said first diode via said second inductor, for driving said first and second diodes;
a serial resonant circuit connected between the base of said amplifying transistor and a grounding point, and having a resonance frequency within an operating frequency band of said amplifying transistor, and
a switch connected between said serial resonant circuit and the grounding point, wherein,
in an amplification mode, said bias circuit supplies the bias current to said amplifying transistor, and said first current mirror circuit turns off said first and second diodes and said switch, and
in an attenuation mode, said bias circuit supplies no bias current to said amplifying transistor, and said first current mirror circuit turns on said first and second diodes and said switch.

2. The power amplifier according to claim 1, wherein said switch comprises:
a third diode having an anode and a cathode, the anode being connected to said serial resonant circuit, and the cathode being connected to the grounding point; and
a resistor connected between the anode of said third diode and a control terminal wherein a low-level voltage is applied in the amplification mode to the control terminal, and a high-level voltage is applied to the control terminal in the attenuation mode.

3. The power amplifier according to claim 1, wherein said switch comprises:
a third diode having an anode and a cathode, the anode being connected to said serial resonant circuit;
a resistor connected between the anode of said third diode and a second power terminal; and
a second current mirror circuit connected to the cathode of said third diode, for driving said third diode, wherein
in the amplification mode, said second current mirror circuit turns off said third diode, and
in the attenuation mode, said second current mirror circuit turns on said third diode.

\* \* \* \* \*